(12) United States Patent
Okada et al.

(10) Patent No.: US 9,926,637 B2
(45) Date of Patent: Mar. 27, 2018

(54) TIN OR TIN ALLOY PLATING LIQUID (71) Applicant: Rohm and Haas Electronic Materials LLC, Marlborough, MA (US)

(72) Inventors: Hiroki Okada, Niigata (JP); Shenghua Li, Niigata (JP); Makoto Kondo, Saitama (JP)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 47 days.

(21) Appl. No.: 14/972,349

(22) Filed: Dec. 17, 2015

(65) Prior Publication Data

US 2016/0102413 A1 Apr. 14, 2016

Related U.S. Application Data

(62) Division of application No. 14/142,443, filed on Dec. 27, 2013, now abandoned.

(51) Int. Cl.
| | |
|---|---|
| *C25D 3/32* | (2006.01) |
| *C25D 3/60* | (2006.01) |
| *C25D 5/02* | (2006.01) |
| *C25D 7/12* | (2006.01) |
| *H01L 21/288* | (2006.01) |

(Continued)

(52) U.S. Cl.
CPC .............. *C25D 3/32* (2013.01); *C25D 3/60* (2013.01); *C25D 5/022* (2013.01); *C25D 7/123* (2013.01); *H01L 21/2885* (2013.01); *H01L 21/76879* (2013.01); *H05K 3/4007* (2013.01); *C23C 18/1605* (2013.01); *C23C 18/1653* (2013.01); *H05K 3/187* (2013.01); *H05K 3/423* (2013.01);

(Continued)

(58) Field of Classification Search
CPC ... C25D 3/30; C25D 3/32; C25D 3/60; C25D 5/022; C25D 7/123; C23C 18/1605; C23C 18/1653; H01L 21/2885; H01L 21/76879; H05K 3/187; H05K 3/4007; H05K 3/423; H05K 2201/0305; H05K 2201/0367; H05K 2201/09563
See application file for complete search history.

(56) References Cited

U.S. PATENT DOCUMENTS

| | | | |
|---|---|---|---|
| 3,361,652 A | 1/1968 | Korpiun et al. | |
| 3,471,379 A | 10/1969 | Schoot et al. | |

(Continued)

FOREIGN PATENT DOCUMENTS

| | | |
|---|---|---|
| CN | 102418123 | 4/2012 |
| EP | 1029947 | 8/2000 |

(Continued)

OTHER PUBLICATIONS

Search Report from corresponding Chinese application, dated Nov. 5, 2015.

*Primary Examiner* — Louis J Rufo
(74) *Attorney, Agent, or Firm* — John J. Piskorski (57) ABSTRACT

Tin or tin alloy plating liquid with a sufficient plated deposit can be formed in the opening without causing burns on the plated film surface or abnormal deposits, and which has a good via filling effect. When a specific $\alpha$, $\beta$-unsaturated carbonyl compound is added into the tin or tin alloy plating liquid, the plating liquid with good via filling performance can be obtained, and the deposit which is substantially free of voids and burns or abnormal deposits on the deposit surface are reduced.

4 Claims, 2 Drawing Sheets

(51) Int. Cl.
    *H01L 21/768* (2006.01)
    *H05K 3/40* (2006.01)
    *C23C 8/16* (2006.01)
    *H05K 3/18* (2006.01)
    *H05K 3/42* (2006.01)
    *C23C 18/16* (2006.01)

(52) U.S. Cl.
    CPC ............... *H05K 2201/0305* (2013.01); *H05K 2201/0367* (2013.01); *H05K 2201/09563* (2013.01)

(56) References Cited

U.S. PATENT DOCUMENTS

| | | | |
|---|---|---|---|
| 4,207,148 | A | 6/1980 | Hsu |
| 4,582,576 | A * | 4/1986 | Opaskar .................. C25D 3/32 106/1.22 |
| 4,849,059 | A | 7/1989 | Deresh et al. |
| 7,968,444 | B2 | 6/2011 | Lou et al. |
| 2010/0000873 | A1 | 1/2010 | Imanari et al. |
| 2011/0189848 | A1* | 8/2011 | Ewert ...................... C25D 3/32 438/612 |

FOREIGN PATENT DOCUMENTS

| | | |
|---|---|---|
| EP | 2221396 | 8/2010 |
| JP | 0483894 | 3/1992 |
| JP | 11269692 | 10/1999 |
| JP | 2001262391 | 9/2001 |
| JP | 2009256730 | 11/2009 |
| RU | 2032775 | 4/1995 |

* cited by examiner

TIN OR TIN ALLOY PLATING LIQUID

The present application is a divisional application of co-pending patent application Ser. No. 14/142,443, filed Dec. 27, 2013.

FIELD OF THE INVENTION

This invention relates to a tin or tin alloy electroplating liquid which is suitable for via filling which deposits tin or a tin alloy selectively in a via, and a method for via filling using the liquid.

Further, this invention relates to the tin or tin alloy electroplating liquid which is suitable to be used for the method for bump forming in the bonding of electronic components and includes the via fill process, and also which relates to a bump including tin or a tin alloy formed by the plating liquid. In particular, it relates to a bump that include tin or a tin alloy, which is used for electrical connections between a chip and a circuit substrate when bonding a semiconductor integrated circuit (LSI) chip onto a circuit substrate.

BACKGROUND OF THE INVENTION

Concerning the formation of the passage between the layers of a semiconductor integrated circuit, so called via filling in which the plating is done selectively for the indented part or via on the material to be plated is becoming increasingly important recently. However, when plating is done on the material that has an indented part, it tends to form the plated film on the outer surfaces other than the indented part, and only a thin plated film might be formed in the indented part, or the surface of the indented part becomes closed even though the deposit of plating in the indented part is insufficient so that the plated film that has void spaces tends to be generated, and this is a problem.

Via filling is also used for the case of forming the solder bumps on the electrode terminals of the LSI chip, and the above mentioned problem of via filling has been occurring in bump forming too.

Recently, accompanying the large increase in density and high integration of the semiconductor integrated circuits (LSI) used for electronic equipment, making many pins and a narrow pitch of electrode terminals on LSI chips is rapidly progressing. For bonding these LSI chips onto the circuit substrate, in order to make the small size of electronic parts possible and to make the wiring delay to be less, flip-chip bonding is widely used. In this flip-chip bonding a common way is such that a solder bump is formed on the electrode terminal of the LSI chip, and via the solder bump, it is jointed as a whole to the connecting terminal that is formed on the circuit substrate. As the electrode pitch becomes narrower, the bumps that correspond to this narrow pitch must be formed.

Until now, as methods for forming the bumps, a solder ball is placed on the electrode, or solder paste is applied by a screen print or coating methods have been developed. However, with the solder ball method, the solder ball must be accurately placed on an individual electrode and this is a nuisance. Also, when the electrode pitch becomes narrower, it becomes technically more difficult. Also, with the screen print method the solder paste is printed using a mask, therefore, in the same way it is difficult to accurately form the bump on an individual pad that is configured with the above mentioned narrow pitch. Kokai Patent No. 2000-094179 describes a method in which the solder paste that includes solder powder is coated on the substrate that has the electrode and the solder is melted by heating the substrate, thus the solder bump is formed selectively on the electrode. However, since the paste-like composition is coated on the substrate, localized unevenness in the thickness or concentration occurs, so that differences occur in the amount of solder deposited per electrode or the bumps of uniform height cannot be obtained and this was a problem.

On the other hand, U.S. Pat. No. 7,098,126 describes a method in which a mask layer is placed on the circuit plate that includes at least one contact region, and the pattern formation is done and the pad is exposed, and the metal seed layer is deposited on the entire surface of the substrate by physical vapor deposition, chemical vapor deposition, electroless plating or electroplating, and the resist layer is formed on the metal seed layer, and an opening is formed at a position on the contact pad, and the solder material is deposited at the opening by electroplating, thus via filling is done. The resist and the metal seed layer that is directly under the resist are removed, thus the solder bump is formed on the substrate. However, the Description in U.S. Pat. No. 7,098,126 says that the solder material that is formed at the opening by electroplating is an alloy that contains lead, tin, silver, copper, bismuth, etc., but the method to solve the above mentioned problem of via filling and the composition of the plating liquid are not disclosed at all.

Also, Kokai Patent No. 2012-506628 describes a method in which the substrate has a surface which contains at least one prepared contact region, and the solder mask layer, with which the pattern forming is done, is formed and the contact region is exposed, and the entire substrate region that includes the solder mask layer and the contact region is contacted with a solution that is suitable to provide the conductive layer. Tin or tin alloy electroplating is conducted on the conductive layer and the contact region is via filled. The tin or tin alloy plated layer of the solder mask region and the conductive layer are removed and the solder bump is formed on the substrate. In addition, Kokai Patent No. 2012-506628 discloses a composition as the tin or tin alloy plating liquid, that includes a tin ion source, an acid, an antioxidant, and a leveling agent that can be selected from aromatic aldehydes, aromatic ketones and $\alpha/\beta$ unsaturated carboxylic acids. However, according to the study done by Inventors, the tin plating liquid that uses an $\alpha/\beta$ unsaturated carboxylic acid, an $\alpha/\beta$ unsaturated ester or an $\alpha/\beta$ unsaturated acid anhydride cannot obtain a sufficient via fill effect (from now on, this will be called the leveling effect) in which the plate is selectively deposited in the indented part. Also, the tin plating liquid that uses an aromatic aldehyde or an aromatic ketone has a problems that burns, dendrites and powder on the formed plated film surface so that a practical and good appearance cannot be obtained and the film characteristics such as soldering ability or color change resistance are poor.

SUMMARY OF THE INVENTION

The main objective of this invention is to provide a tin or tin alloy plating liquid with which a sufficient deposit of plating can be formed in the opening without causing burns on the plated film surface or abnormal deposits, and which can form a sufficient deposit of plating on the opening, and which has a good via fill effect. This invention also provides a method for forming the bumps that contain tin or tin alloy which includes the via filling process using the above mentioned tin or tin alloy plating liquid of this invention, and also to provide bumps that can be formed by using this method.

The inventors discovered that the above mentioned problems can be solved when a specific α, β-unsaturated carbonyl compound is added into the tin or tin alloy plating liquid. Namely, this invention offers at least the following (i)-(iv):

(i) Tin or tin alloy electric plating liquid characterized by containing at least one compound that can be indicated by the following general formula (1):

(1)

In the formula, $R^1$ is selected from the group consisting of hydrogen atoms; halogen atom; substituted or non-substituted $C_1$-$C_{20}$ alkyl groups; $C_2$-$C_{20}$ alkenyl groups; $C_4$-$C_{20}$ dienyl groups; $C_3$-$C_{20}$ cyclo alkyl groups; $C_3$-$C_{20}$ cyclo alkenyl groups; and $C_4$-$C_{20}$ cyclo dienyl groups; and the amino groups that can be indicated by —$NR^5R^6$, where $R^5$ and $R^6$ are each independently hydrogen atoms or substituted or non substituted $C_1$-$C_{20}$ alkyl groups; $R^2$, $R^3$ and $R^4$ are independently selected from the group consisting of hydrogen atoms; halogen atoms; substituted or non-substituted $C_1$-$C_{20}$ alkyl groups; $C_2$-$C_{20}$ alkenyl groups; $C_4$-$C_{20}$ dienyl groups; $C_3$-$C_{20}$ cyclo alkyl groups; $C_3$-$C_{20}$ cyclo alkenyl groups; and $C_4$-$C_{20}$ cyclo dienyl groups, $R^2$ and $R^4$, or $R^1$ and $R^3$ may be bonded together to form a ring, and the formed ring may have one or more double bonds. When $R^1$ is an amino group having formula —$NR^5R^6$, the above mentioned ring is hetero ring in which $R^5$ or $R^6$ are bonded with $R^3$, and in the case when $R^1$ is a substituted or non-substituted $C_1$-$C_{20}$ alkyl group, $C_2$-$C_{20}$ alkenyl group, or $C_4$-$C_{20}$ dienyl group, the above mentioned ring may be a hetero ring that has one oxygen atom between the carbonyl carbon and $R^1$.

(ii) Tin or tin alloy electroplating liquid in which the compound that can be indicated by the above mentioned general formula (1) is an α, β-unsaturated aldehyde or an α, β-unsaturated ketone, as was described in the above mentioned (i).

(iii) Method for filling a via formed on a surface of a material to be plated with the deposited plating using the tin or tin alloy plating liquid, and it is characterized by conducting the process of electroplating using the tin or tin alloy plating liquid described in the above mentioned (i).

(iv) Method for forming a bump that contains tin or tin alloy on a substrate, and which includes the following processes:
1) forming a protection layer that has an opening on a substrate, and
2) forming a deposit of plating on the above mentioned opening using the tin or tin alloy electroplating liquid described in the above mentioned (i).

(v) Method characterized by the protection layer is a light sensitive resin or a thermosetting resin, as was described in the above mentioned (iv).

(vi) Method which further includes the process in which the conductive layer is formed on at least the bottom part of the opening, prior to the process of forming the plate deposit at the opening using the tin or tin alloy electroplating liquid, as was described in the above mentioned (iv).

(vii) Bumps that contain tin or a tin alloy that are formed using the tin or tin alloy electroplating liquid that was described in the above mentioned (i).

As will be explained below, the tin or tin alloy plating liquid of this invention is the plating liquid that exhibits a high via fill effect. When the plating liquid of this invention is used, the plating is deposited selectively in the indented part, therefore, the deposition of plating which is free of void spaces can be obtained. Also, when the tin or tin alloy plating liquid of this invention is used, the plated film surface does not experience burns or abnormal deposits, therefore, the plated film which has excellent soldering ability and excellent color change resistance and which is practical and has a good appearance can be obtained.

In addition, the plating liquid of this invention have good via filling ability, therefore, the column-like plating deposition which do not have voids can be formed.

DETAILED DESCRIPTION OF THE INVENTION

In this Description, "plating liquid" and "plating bath" are used interchangeably. ° C. is centigrade degree, g/L is gram per litter, mL/L is milliliter per litter, μm is micro meter, m/min is meter per minute, $A/dm^2$ is amps/per square decimeter. All numerical ranges are inclusive and combinable in any order, except where it is logical that such numerical ranges are constrained to add up to 100%.

This invention is the tin or tin alloy electroplating liquid characterized by containing the compound of the following general formula (1).

(1)

In the formula, $R^1$ can be chosen from hydrogen atoms; halogen atoms; substituted or non-substituted $C_1$-$C_{20}$ alkyl groups; $C_2$-$C_{20}$ alkenyl groups; $C_4$-$C_{20}$ dienyl groups; $C_3$-$C_{20}$ cyclo alkyl groups; $C_3$-$C_{20}$ cyclo alkenyl groups; and $C_4$-$C_{20}$ cyclo dienyl groups; and the amino groups represented by —$NR^5R^6$. $R^5$ and $R^6$ can be each independently hydrogen atoms or substituted or non substituted $C_1$-$C_{20}$ alkyl groups. $R^2$-$R^4$ can be each independently chosen from hydrogen atoms; halogen atoms; substituted or non-substituted $C_1$-$C_{20}$ alkyl groups; $C_2$-$C_{20}$ alkenyl group; $C_4$-$C_{20}$ dienyl groups; $C_3$-$C_{20}$ cyclo alkyl groups; $C_3$-$C_{20}$ cyclo alkenyl groups; and $C_4$-$C_{20}$ cyclo dienyl groups. $R^2$ and $R^4$, or $R^1$ and $R^3$ may be bonded together to form a ring, and the formed ring may have one or more double bonds. When $R^1$ is an amino group that can be indicated by the above mentioned formula —$NR^5R^6$, the above mentioned ring is a hetero ring in which $R^5$ or $R^6$ bonded with $R^3$. In the case when $R^1$ is a substituted or non-substituted $C_1$-$C_{20}$ alkyl group, $C_2$-$C_{20}$ alkenyl group, or $C_4$-$C_{20}$ dienyl group, the above mentioned ring may be a hetero ring that has one oxygen atom between the carbonyl carbon and $R^1$.

The $C_1$-$C_{20}$ alkyl groups; $C_2$-$C_{20}$ alkenyl groups; $C_4$-$C_{20}$ dienyl groups; $C_3$-$C_{20}$ cyclo alkyl groups; $C_3$-$C_{20}$ cyclo alkenyl groups; and $C_4$-$C_{20}$ cyclo dienyl groups of the above mentioned $R^1$-$R^4$, and the $C_1$-$C_{20}$ alkyl groups of $R^5$, $R^6$ can have one or more substitution groups chosen from alkyl groups with 1-9 carbon atoms, alkenyl groups, alkoxy groups, amino groups, halogen atoms, hydroxyl groups, carbonyl groups, and cyano groups.

Compounds of general formula (1) include but are not limited to: α, β-unsaturated aldehydes; α, β-unsaturated ketones; α, β-unsaturated halides; α, β-unsaturated lactones (cyclic esters); α, β-unsaturated amides; and α, β-unsaturated lactams (cyclic amides). Among these, α, β-unsaturated aldehydes and α, β-unsaturated ketones are preferred. When $R^1$ is a hydroxyl group, it becomes an α, β-unsaturated carboxylic acid, however, the compound has poor via filling ability, therefore it is not included in this invention. Also, α, β-unsaturated carboxylic acid anhydrides and α, β-unsaturated carboxylic acid esters, excluding where the α, β-unsaturated carboxylic acid ester is a cyclic ester, have poor via filling ability, therefore they are not included in this invention. Further, the aromatic aldehydes and aromatic ketones which do not have an unsaturated group in the α, β position are not included in this invention, because the obtained plated film surface has dendrites, burns or skip plating, and those are not preferred. α, β-unsaturated aldehyde is a general name for compounds which have an unsaturated double bond between the α position and the β position of the carbon atoms looking at it from the carbonyl group, and this is the same for the other α, β-unsaturated compounds as well.

Examples of compounds covered by the general formula (1) include the compounds shown below:

When $R^2$ and $R^4$ in the general formula (1) bond to form a ring, the compound that can be indicated by general formula (1) may have the structure having the following general formula (2) as well.

(2)

In the general formula (2), $R^7$ can be a substituted or non-substituted $C_1$-$C_{40}$, $C_1$-$C_{20}$, or $C_1$-$C_{10}$ alkylene, or $C_2$-$C_{40}$, $C_2$-$C_{20}$ or $C_2$-$C_{10}$ alkene di-yl that has one or more double bonds, and $R^7$ can have one or more substitution groups chosen from alkyl groups with 1-9 carbon atoms, alkenyl groups, alkoxy groups, amino groups, halogen atoms, hydroxyl groups, carbonyl groups and cyano groups.

Compounds of general formula (2), include, but are not limited to the following compounds:

-continued 1-acetyl-2-methyl-1-cyclo pentene damascone

1-acetyl-1-cyclo hexene    1-acetyl-1-cyclo pentene

Also, when $R^1$ and $R^3$ in the general formula (1) are bonded to form a ring, the compounds that can be indicated by the general formula (1) may be the structure that can have the following general formula (3) as well.

(3)

In the general formula (3), $R^8$ can be a substituted or non-substituted $C_1$-$C_{40}$, $C_1$-$C_{20}$, or $C_1$-$C_{10}$ alkylene, or $C_2$-$C_{40}$, $C_2$-$C_{20}$ or $C_2$-$C_{10}$ alkene di-yl that has one or more double bonds, and it may form a hetero cycle that includes one or more atoms chosen from nitrogen atoms and oxygen atoms as the hetero atom between the carbonyl carbon and $R^1$, and also $R^8$ can have one or more substitution groups chosen from alkyl groups with 1-9 carbon atoms, alkenyl groups, alkoxy groups, amino groups, halogen atoms, hydroxyl groups, carbonyl groups and cyano groups.

Compounds that are included by general formula (3) are the compounds below:

cyclo-hexenone    di-hydro jasmone    carvone cis jasmone    iso jasmone 3-methyl-2-cyclo pentenone    2-cyclo pentene-1-one 2-methyl-2-cyclo pentene-1-one    γ-crotonolactone 3,4-di-hydro piperidone Among these, β-ionone; 1-acetyl-1-cyclohexene; citral; 4-hexene-3-one; α-ionone and β-damascone which are α, β-unsaturated aldehydes or α, β-unsaturated ketones, are preferred.

In the tin or tin alloy electroplating liquid of this invention, the α, β-unsaturated carbonyl compound that can be indicated by the general formula (1) should be included in the range of 0.0001-10 g/L, preferably 0.0005-5 g/L, more preferably 0.001-1 g/L, and more preferably it should be included in the range of 0.01-0.5 g/L.

The tin or tin alloy electroplating liquid of this invention includes a tin ion source and an acid in addition to the above mentioned α, β-unsaturated carbonyl compound, and further, it may include a second metal ion source that forms an alloy with tin, and other additives too.

Any tin ion source may be used as long as it can provide tin ions in the plating liquid, and it may be an inorganic salt, an organic salt, a complex, or metallic tin. Tin ion sources include, but are not limited to tin salts of inorganic acids such as sulfuric acid; borofluoric acid; silicofluoric acid; sulfamic acid, hydrochloric acid; pyro phosphoric acid, and tin salts or tin complexes of methane sulfonic acid; 2-propanol sulfonic acid; phenol sulfonic acid; sulfo succinic acid; acetic acid; oxalic acid; malonic acid; succinic acid; glycolic acid; tartaric acid; citric acid; gluconic acid; glycine; mercapto succinic acid; ethylene diamine tetra acetic acid; imino di-acetic acid; nitrilo tri acetic acid; di-ethylene tri amine penta acetic acid; tri ethylene tetramine hexa acetic acid; ethylene di-oxy bis(ethyl amine)-N,N,N',N'-tetra acetic acid; glycol ethylene di-amine tetra acetic acid; and N-(2-hydroxy ethyl)ethylene di-amine tri acetic acid. Also, in the case of using metallic tin, the metallic tin can be used as the anode electrode in electroplating. Among these tin ion sources, tin sulfate; tin chloride; tin methane sulfonate and tin phenol sulfonate are preferred.

The amount of the tin ion source to be used should be 5-500 g/L, preferably 20-200 g/L as tin ions in the plating liquid.

Concerning the acid, already known compounds can be used, for instance, the acid component that is used for the above mentioned tin salt or tin complex can be used. The amount of acid to be used should be 1-500 g/L, preferably 20-200 g/L in the plating liquid.

In addition to the tin ion source, the plating liquid of this invention may include an alloying metallic ion source (second metal ion source) other than tin. Depending on the targeted tin alloy, the second metal includes but is not limited to: silver; copper; gold; platinum; zinc; nickel; bismuth; indium; thallium; antimony; palladium; rhodium; iridium; and lead. As the second metallic ion source, inorganic salts, organic salts or complexes of these metals can be used, and for instance, the salts of the acids described in the above mentioned tin salts or tin complexes, can be used. Also, two or more can be used as the second metal ion.

The amount of the second metal ion source can vary depending on the type of the plating bath, the type of metal to make the alloy and the alloy composition; however, it should be in the range of 0.1-500 g/L. For instance, in the case of making a near eutectic composition of tin-silver by adding a slight amount of silver into tin, it should be 0.1-3.5 g/L in the plating liquid, and in the case of conducting the plating of a tin-indium alloy with a low melting temperature, it needs to be 1-500 g/L. When two or more metals are used as the second metal ion sources, the same is also true.

The plating liquid of this invention can include other additives too. Such additives include, but are not limited to an antioxidant, a surfactant, a complexing agent, a pH adjusting agent, a brightener, and grain refiners.

Antioxidant include, but are not limited to: catechol; resorcinol; hydroquinone; pyrogallol; oxy hydroquinone; fluoro glucine; 3,4,5-tri hydroxy benzoic acid; p-phenol sulfonic acid; cresol sulfonic acid; catechol sulfonic acid; and hydroquinone sulfonic acid. The amount of antioxidant should be 0.01~5 g/L, preferably 0.1~2 g/L, in the plating liquid.

Surfactants which may be used are those that solubilize the $\alpha, \beta$-unsaturated carbonyl compound used in this invention and has the function of restricting deposits at the high current density area. Such surfactants include known cationic surfactants, anionic surfactants, nonionic surfactants and amphoteric surfactants; however, the preferred ones are non-ionic surfactants. Non-ionic surfactants include, but are not limited to poly oxy alkylene alkyl ethers or esters; poly oxy alkylene phenyl ethers; poly oxy alkylene alkyl phenyl ethers; poly oxy alkylene naphthyl ethers; poly oxy alkylene alkyl naphthol ethers; poly oxy alkylene styrenated phenyl ethers or poly oxy alkylene styrenated phenyl ether where a poly oxy alkylene chain is further added onto the said phenyl group; poly oxy alkylene bis phenol ethers; poly oxy ethylene poly oxy propylene block polymers; poly oxy alkylene sorbitan fatty acid esters; poly oxy alkylene sorbit fatty acid esters; poly ethylene glycol fatty acid esters; poly oxy alkylene glycerin fatty acid esters; poly oxy alkylene alkyl amines; poly oxy alkylene condensation-added material of ethylene diamine; poly oxy alkylene fatty acid amides; poly oxy alkylene castor oil and/or hardened castor oil; poly oxy alkylene alkyl phenyl formalin condensed material; glycerin or poly glycerin, fatty acid esters; penta erythritol fatty acid esters; sorbitan mono, sesqui and tri-fatty acid esters; high rank fatty acid mono and di ethanol amides; alkyl.alkylol amides; and oxy ethylene alkyl amines. The amount of these surfactants should be 0.05-25 g/L, preferably 0.1-10 g/L in the plating liquid.

A complexing agent is suitable especially when making the tin alloy plating liquid for dissolving a second metal. Complexing agents include, but are not limited to: thiourea; allyl thiourea; and 3,6-di-thiaoctane-1,8-diol. The amount to be used should be 0.01-50 g/L, preferably 0.1-10 g/L.

As described above, the tin or tin alloy plating liquid of this invention has a good effect for via filling. Normally, when the plating is performed for the material that has indented parts, the plated film tends to be formed on outer surfaces other than the indented part, and only very thin plate is formed in the indented part, or the surface is closed even though the deposition of plating is insufficient in the indented part and the plated film with void spaces tends to be formed. However, when the plating liquid of this invention is used, the plating is deposited selectively in the indented part; therefore, the deposited plating which practically does not have void spaces can be obtained. Also, when the tin or tin alloy plating liquid of this invention is used, the plated surface that was formed does not experience burns or abnormal deposits. Therefore, the plated film which is practical and has good appearance, excellent soldering ability and excellent color change resistance is obtained. Therefore, the plating liquid of this invention is suitable for bump formation which includes via filling processes, and for forming tin and tin alloy bumps.

One embodiment of the method of this invention is the method for filling vias on the surface of the material to be plated with the plating deposit. It is characterized by electroplating using the tin or tin alloy plating liquid of this invention. The material to be plated has at least one via formed, and the size is not limited. The method of this invention preferably fills vias which have diameters from 10-100 μm with depths of 10-100 μm. The material to be plated includes but is not limited to electric substrates and electronic components such as semiconductor chips. Substrates that have electrodes are preferred since sufficient plated deposit can be formed on the opened part provided in the electrode position on the substrate.

Also, another embodiment of this invention is the method to form bumps that contain tin or tin alloy on the substrate. This embodiment includes the following processes:
(1) Forming a protection layer that has an opened part on the substrate, and
(2) Forming the plate deposit on the above mentioned opened part using the tin or tin alloy electroplating liquid of this invention.

The protection layer is the layer which is formed prior to the plating on the place where the deposit should not be made on the substrate, and both the layer that is peeled after the plate deposit is formed (this is also called a resist), and the layer that will remain without being peeled, are included. Concerning the forming of the protection layer that has the opening on the substrate, any existing method can be used, however, the method which uses a photosensitive resin or a thermosetting resin as the protection layer, is preferred. In this invention, photosensitive resin means a resin that reacts with various light sources such as visible light, UV, X-rays or electron beams. The resin becomes soluble or insoluble in the developing solution, and either the negative type or positive type can be used. Also, after the thermosetting resin is cured by heat, the opening can be formed by a laser or other conventional process.

Concerning the specific method for forming the opening, as was described in the description of U.S. Pat. No. 7,098,126, a barrier layer is formed on the contact pad, and the solder mask is formed on the places where the plate deposit is not necessary, and the patterning is done, and the barrier layer on the contact pad is exposed, and after the metal conductive layer is formed by physical vapor deposition (PVD), chemical vapor deposition (CVD), or electro or electroless plating beforehand, the patterning is done using the resist and the opening is formed. Also, as was described in Kokai patent No. 2012-506628, using the negative type photoresist, the solder mask layer is exposed and the opening is formed, and thereafter, the conductive layer is formed on the entire body of the opening and the solder mask layer.

The above mentioned opening can be any size, however, generally, it is a via of which the diameter is 10-100 μm, and the depth is 10-100 μm. It is preferred that the conductive layer is formed at least on the bottom part of the opening of the protection layer before electroplating using the plating liquid of this invention. The above mentioned conductive layer can be the layer that is comprised of copper; tin; cobalt; tin-lead alloy; chromium-copper alloy; titanium/nickel (bimetal), tin/copper; chromium/chromium-copper alloy/copper; or nickel/tin/copper. The conductive layer can be formed by PVD or CVD, or electroless plating or electroplating. For instance, after the catalyst that contains noble metal ions such as palladium is attached, the electroless copper plating or nickel electroplating is done to form the conductive layer.

The bump that contains tin or a tin alloy is formed by using the above mentioned tin or tin alloy plating liquid. As was described above, the plating liquid of this invention exhibits good via fill performance, therefore, it can form a column-like deposit which practically does not have voids. The bump that contains tin or a tin alloy means the bump of which the main component is tin or a tin alloy, and for instance, it may be the bump comprised of two layers where the foundation of the bump is made first by another metal plating liquid, and on top of this, the tin or tin alloy column is formed, or it may be the one in which the bump containing two layers is reflowed and both are mixed as one body. The bump means a protrusion that is formed on the semiconductor chip or substrate, and it becomes the terminal to connect the semiconductor chip and substrate. Generally, the bump can be of any size. Typically the diameter is from 10-100 μm, and the height is from 10-100 μm.

When the bump of this invention is contains a tin alloy, the tin and the second metal that forms the alloy are the metals that were previously described above for the tin alloy plating liquid. Concerning the composition of the alloy, the content of the second metal should be 0.1-50%, preferably 1-5% with the remainder tin.

Example 1

A copper clad FR4 substrate was submerged in the pre-treatment liquid (CIRCUBOND™ 187 treatment solution available from Dow Electronic Materials, Marlborough, Mass.) for 2 minutes at 45° C., and the copper clad surface was made rough. On top of this, a photosensitive insulation resin (MultiPosit™ 9500cc photosensitive resin available from Dow Electronic Materials) was coated by a spin coater, and exposure, baking and development were done, and thus, a via with a depth of 20 μm and a diameter of 50 μm was formed.

Thereafter, it was washed with a surface cleansing agent at 70° C. (CIRCUPOSIT™ MLB 211 cleaning agent available from Dow Electronic Materials) and then washed with water, and it was desmeared at 80° C. with CIRCUPOSIT™ MLB 213 solution (available from Dow Electronic Materials) for 2.5 minutes, and continuously, it was treated at 45° C. with a neutralizing agent (CIRCUPOSIT™ MLB 216 solution available from Dow Electronic Materials) for 5 minutes. Thereafter, electroless plating was conducted with an electroless copper plating liquid (CUPOSIT™ 328 copper plating bath available from Dow Electronic Materials) at 30° C. for 40 minutes, and a 1 μm thick seed layer was formed. The substrate with the via was used as the evaluation substrate and the following test was conducted and the leveling performance was evaluated.

The following tin plating liquid was prepared:
Tin methane sulfonate: as tin ions, 45 g/L
Methane sulfonic acid (79% solution): 85 mL/L
Surfactant (poly oxy ethylene poly oxy propylene alkyl ether (Pegnol™ D-210Y, available from
Toho Kagaku Kogyo K.K.): 0.5 g/L
β-ionone: 0.07 g/L
Catechol: 2 g/L

The evaluation substrate was submerged in 10 mL/L of a methane sulfonic acid solution (70% solution) for 1 minute, and the surface was activated. Thereafter, it was washed with de-ionized water for 2 minutes, and using this evaluation substrate as the cathode, electroplating was conducted for 11 minutes at 1 A/dm$^2$ using the above mentioned plating liquid while stirring at a speed of 2 m/min After plating, and after washing with de-ionized water and drying, the via of the substrate was cut, and it was observed with a bright field microscope.

Example 2

Example 1 was repeated except that 1-acetyl-1-cyclo hexene was used at 0.12 g/L instead of β-ionone, and the via cross section was observed.

Example 3

Example 1 was repeated except that citral was used at 0.2 g/L instead of β-ionone, and surfactant 1 at 0.15 g/L and surfactant 2(β-naphthol ethoxylate, commercial product Lugalvan™ BNO 12 available from BASF Co.) at 0.5 g/L were used as the surfactants, and the via cross section was observed.

Surfactant 2

Example 4

Example 1 was repeated except that 4-hexene-3-one was used at 0.3 g/L instead of β-ionone, and that the concentration of surfactant 1 was changed to 2 g/L, and the via cross section was observed.

Example 5

Example 1 was repeated except that β-damascone was used at 0.02 g/L instead of β-ionone, and that the concentration of surfactant 1 was changed to 0.75 g/L, and the via cross section was observed.

Example 6

Example 1 was repeated except that tin methane sulfonate at 20 g/L and silver methane sulfonate at 0.5 g/L were used as the metal ion sources, and that β-damascone was used at 0.02 g/L instead of β-ionone, and 3,6-dithia-1,8-octane diol which has the structure shown below, was used at 2.6 g/L as the complexing agent, and the via cross section was observed.

3,6-dithia-1,8-octane diol

Figure 1:
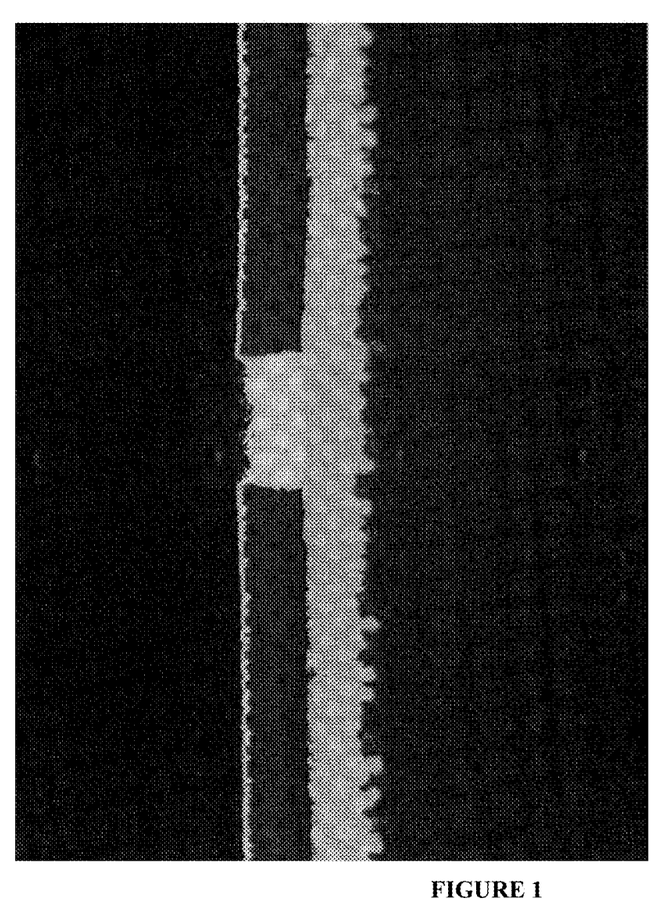
FIG. 1 is the bright vision field microscope photo of the via cross section that was made in Example 1.

The compositions of Examples 1-6, the via fill performance and the appearance are shown in Table 1. Also, a bright field microscopic photo of the cross section of the via that was made in Example 1 is shown in FIG. 1.

TABLE 1

| | Example | 1 | 2 | 3 | 4 | 5 | 6 |
|---|---|---|---|---|---|---|---|
| Metal ion source (g/L as metal ions) | Tin methane sulfonate | 45 | 45 | 45 | 45 | 45 | 20 |
| sulfonate | Silver methane | | | | | | 0.5 |
| Acid (mL/L) | Methane sulfonic acid | 85 | 85 | 85 | 85 | 85 | 34 |
| α, β-unsaturated carbonyl compound (g/L) | β-ionone | 0.07 | | | | | |
| | 1-acetyl 1 cyclo hexene | | 0.12 | | | | |
| | Citral | | | 0.2 | | | |
| | 4-hexene-3-one | | | | 0.3 | | |
| | β-damascone | | | | | 0.02 | 0.02 |
| Oxidation inhibitor (g/L) | Catechol | 2 | 2 | 2 | 2 | 2 | 2 |
| Surfactant (g/L) | 1 | 0.5 | 0.5 | 0.15 | 2 | 0.75 | 1 |
| | 2 | | | 0.5 | | | |
| Complexing agent (g/L) | 3,6-dithia-1,8-octane diol | | | | | | 2.6 |
| Result | Degree of leveling | Perfect | Perfect | Perfect | Perfect | Perfect | Perfect |
| | Condition of deposited film surface | No problems | No problems | No problems | No problems | No problems | No problems |

Surfactant 1: Poly oxy ethylene poly oxy propylene alkyl ether, commercial name: Pegnol ™ D-210Y (available from Toho Kagaku Kogyo K. K.)
Surfactant 2: β-naphthol ethoxylate, commercial mane. Lugalvan ™ BNO 12 (available from BASF Co.)

Comparative 1

Example 1 was repeated except that di-hydro-β-ionone was used at 0.2 g/L instead of β-ionone, and the via cross section was observed. Filling of the via was insufficient.

Di-hydro β-ionone

Comparative 2

Example 1 was repeated except that citronellal having the structure shown below was used at 0.5 g/L instead of β-ionone, and the via cross section was observed. Filling of the via was insufficient.

Citronellal

Comparative 3

Example 1 was repeated except that the acetone having the structure shown below was used at 1 g/L instead of β-ionone, and the via cross section was observed. Filling of the via was insufficient.

Acetone

Comparative 4

Example 1 was repeated except that the methacrylic acid having the structure shown below was used at 1 g/L instead of β-ionone, and surfactant 2 was used at 7 g/L, and the via cross section was observed. Filling of the via was insufficient.

Methacrylic acid

Comparative 5

Example 1 was repeated except that benzaldehyde was used at 0.025 g/L instead of β-ionone, and surfactant 2 was used at 7 g/L instead of surfactant 1, and the via cross section was observed. The via was filled but many areas of skip plating and burns were observed and it was insufficient for practical use.

Comparative 6

Example 1 was repeated except that 3-chloro acetophenone was used at 0.3 g/L instead of β-ionone, and the via cross section was observed. The via was filled but many areas of skip plating and burns were observed and it was insufficient for practical use.

Figure 2:
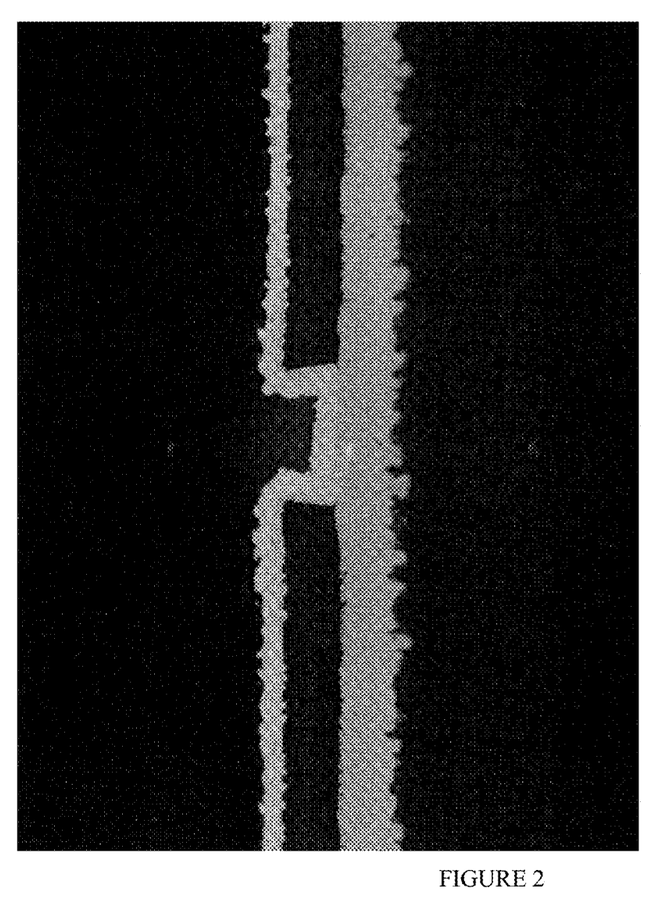
FIG. 2 is the bright vision field microscope photo of the via cross section that was made in Comparison 1.

The compositions of Comparisons 1-6 and the results (via fill performance and appearance) are shown in Table 2. Also, a bright field microscopic photo of the cross section of the via made in Comparison 1 is shown in FIG. 2.

TABLE 2

| | Comparative | 1 | 2 | 3 | 4 | 5 | 6 |
|---|---|---|---|---|---|---|---|
| Metal ion source (g/L as metal ions) | Tin methane sulfonate | 45 | 45 | 45 | 45 | 45 | 85 |
| Acid (mL/L) | Methane sulfonic acid | 85 | 85 | 85 | 85 | 45 | 85 |
| Leveling agent (g/L) | Di-hydro β-ionone | 0.2 | | | | | |
| | Citronellal | | 0.5 | | | | |
| | Acetone | | | 1 | | | |
| | Methacrylic acid | | | | 1 | | |
| | Benz aldehyde | | | | | 0.025 | |
| | 3-chloro acetophenone | | | | | | 0.3 |
| Oxidation preventer (g/L) | Catechol | 2 | 2 | 2 | 2 | 2 | 2 |
| Surfactant (g/L) | 1 | 0.5 | 0.5 | 0.5 | | | 0.5 |
| | 2 | | | | 7 | 7 | |
| Result | Degree of leveling | Some what poor | Some what poor | Some what poor | Some what poor | Poor | Poor |
| | Condition of deposited film surface | No problem | No problem | No problem | No problem | Dendrite deposits | Dendrite deposits |

Surfactant 1: Poly oxy ethylene poly oxy propylene alkyl ether, commercial name: Pegnol™ D-210Y (available from Toho Kagaku Kogyo K. K.)
Surfactant 2: β-naphthol ethoxylate, commercial name: Lugalvan™ BNO 12 (available from BASF Co.)

What is claimed is:

1. A method of electroplating comprising:
   a) providing a substrate comprising vias having diameters of 10-100 pm and depths of 10-100 pm;
   b) immersing the substrate comprising vias having diameters of 10-100 pm and depths of 10-100 pm in an electroplating liquid comprising a source of tin ions and at least one α, β-unsaturated carbonyl compound selected from the group consisting of citral, 4-hexene-3-one, β-ionone, and 1-acetyl-1-cyclohexene, wherein the at least α, β-unsaturated carbonyl compound is in amounts of 0.01-0.5 g/L; and
   c) plating tin in the vias with the electroplating liquid.

2. The method of claim 1, further comprising an alloying metal ion source.

3. The method of claim 2, wherein alloying metals are chosen from silver, copper, gold, platinum, zinc, nickel, bismuth, indium, thallium, antimony, palladium, rhodium, iridium and lead.

4. The method of claim 1, wherein the electroplating liquid further comprises additives chosen from an antioxidant, a complexing agent, a pH adjusting agent, a brightener and a grain refiner.

* * * * *